United States Patent
Nie et al.

(10) Patent No.: US 10,468,573 B2
(45) Date of Patent: Nov. 5, 2019

(54) THERMOELECTRIC CONVERSION MATERIAL

(71) Applicant: FURUKAWA CO., LTD., Tokyo (JP)

(72) Inventors: Ge Nie, Ibaraki (JP); Junqing Guo, Ibaraki (JP); Masaaki Kikuchi, Ibaraki (JP); Takahiro Ochi, Ibaraki (JP); Shogo Suzuki, Ibaraki (JP); Taketoshi Tomida, Ibaraki (JP)

(73) Assignee: FURUKAWA CO., LTD., Tokyo (JP)

( * ) Notice: Subject to any disclaimer, the term of this patent is extended or adjusted under 35 U.S.C. 154(b) by 0 days.

(21) Appl. No.: 15/915,793

(22) Filed: Mar. 8, 2018

(65) Prior Publication Data
US 2018/0269369 A1    Sep. 20, 2018

(30) Foreign Application Priority Data
Mar. 16, 2017  (JP) ................. 2017-050815

(51) Int. Cl.
*H01L 35/18* (2006.01)
*H01L 35/14* (2006.01)
(Continued)

(52) U.S. Cl.
CPC ............ *H01L 35/18* (2013.01); *C22C 1/02* (2013.01); *C22C 12/00* (2013.01); *H01L 35/08* (2013.01);
(Continued)

(58) Field of Classification Search
CPC ......... H01L 35/18; H01L 35/08; H01L 35/10; H01L 35/34; C22C 1/02; C22C 12/00
See application file for complete search history.

(56) References Cited

U.S. PATENT DOCUMENTS

| | | | |
|---|---|---|---|
| 2010/0294326 A1* | 11/2010 | Guo | B22F 3/14 136/238 |
| 2011/0108778 A1* | 5/2011 | Ren | B82Y 30/00 252/521.1 |

(Continued)

FOREIGN PATENT DOCUMENTS

| EP | 2927973 A1 | 10/2015 |
|---|---|---|
| WO | 2009/093455 | 7/2009 |

OTHER PUBLICATIONS

Dahal, Tulashi et al. "Effect of triple fillers in thermoelectric performance of p-type skutterudites," Journal of Alloys and Compounds, Oct. 28, 2014, p. 104-108, vol. 623, Elsevier B.V., The Netherlands; Cited in EESR.

(Continued)

*Primary Examiner* — Jayne L Mershon
(74) *Attorney, Agent, or Firm* — Rankin, Hill & Clark LLP

(57) ABSTRACT

A thermoelectric conversion material has a composition represented by General Formula $L_k R_r T_{t-m} M_m Sb_x$. Here, L includes at least one element selected from rare earth elements. R includes two or more elements selected from the group consisting of alkali metal elements, alkali earth metal elements, Group 4 elements, and Group 13 elements. T includes at least one element selected from Fe and Co. M includes at least one element selected from the group consisting of Ru, Os, Rh, Ir, Ni, Pd, Pt, Cu, Ag, and Au. In addition, $0.50 \leq k \leq 1.00$, $0.1 \leq r \leq 0.5$, $3.0 \leq t-m \leq 5.0$, $0 \leq m \leq 0.5$, $10.0 \leq x \leq 11.5$, and $x/t < 3.0$ are satisfied.

10 Claims, 12 Drawing Sheets

(51) Int. Cl.
*H01L 35/10* (2006.01)
*C22C 12/00* (2006.01)
*H01L 35/34* (2006.01)
*H01L 35/08* (2006.01)
*C22C 1/02* (2006.01)
*C22C 1/04* (2006.01)

(52) U.S. Cl.
CPC .............. *H01L 35/10* (2013.01); *H01L 35/34* (2013.01); *B22F 2998/10* (2013.01); *C22C 1/04* (2013.01)

(56) References Cited

U.S. PATENT DOCUMENTS

2015/0228880 A1    8/2015   Yoshida
2016/0276564 A1*   9/2016   Nie ........................ H01L 35/34

OTHER PUBLICATIONS

Duan, Fenfen et al. "Thermoelectric properties of Sn substituted p-type Nd filled skutterudites," Journal of Alloys and Compounds, Mar. 16, 2015, p. 68-73, vol. 639, Elsevier B.V, The Netherlands; Cited in EESR.

Extended Search Report dated Jul. 12, 2018 for the corresponding European Patent Application No. 18160869.6.

* cited by examiner

THERMOELECTRIC CONVERSION MATERIAL

This application is based on Japanese patent application No. 2017-050815, the content of which is incorporated hereinto by reference.

BACKGROUND

Technical Field

The invention relates to a thermoelectric conversion material.

Related Art

A thermoelectric conversion material is a material that can directly convert thermal energy into electricity, or electric energy into thermal energy. Use of the thermoelectric conversion material allows waste heat, which has not been used in the related art, to be converted into electricity so that the energy is effectively utilized, and thus development of the material has been proceeded in recent years.

Pamphlet of International Publication No. WO 2009/093455 discloses $La_{0.7}Ba_{0.01}Ga_{0.1}Ti_{0.1}Co_1Fe_3Sb_{12}$ as a p-type thermoelectric conversion material, and also discloses that a thermoelectric conversion material having a specific composition has excellent thermoelectric conversion performance.

SUMMARY

However, when a thermoelectric conversion material is used in a high-temperature environment, there are cases where some elements included in the thermoelectric conversion material sublimate, and the thermoelectric conversion performance deteriorates. For this reason, heat resistance of thermoelectric conversion materials is desired to be enhanced.

The present invention provides a thermoelectric conversion material excellent in heat resistance.

According to the present invention, there is provided a thermoelectric conversion material having a composition represented by General Formula $L_k R_r T_{t-m} M_m Sb_x$, in which L includes at least one element selected from rare earth elements, R includes two or more elements selected from the group consisting of alkali metal elements, alkali earth metal elements, Group 4 elements, and Group 13 elements, T includes at least one element selected from Fe and Co, M includes at least one element selected from the group consisting of Ru, Os, Rh, Ir, Ni, Pd, Pt, Cu, Ag, and Au, and $0.50 \leq k \leq 1.00$, $0.1 \leq r \leq 0.5$, $3.0 \leq t-m \leq 5.0$, $0 \leq m \leq 0.5$, $10.0 \leq x \leq 11.5$, and $x/t < 3.0$ are satisfied.

According to the present invention, it is possible to provide a thermoelectric conversion material excellent in heat resistance.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
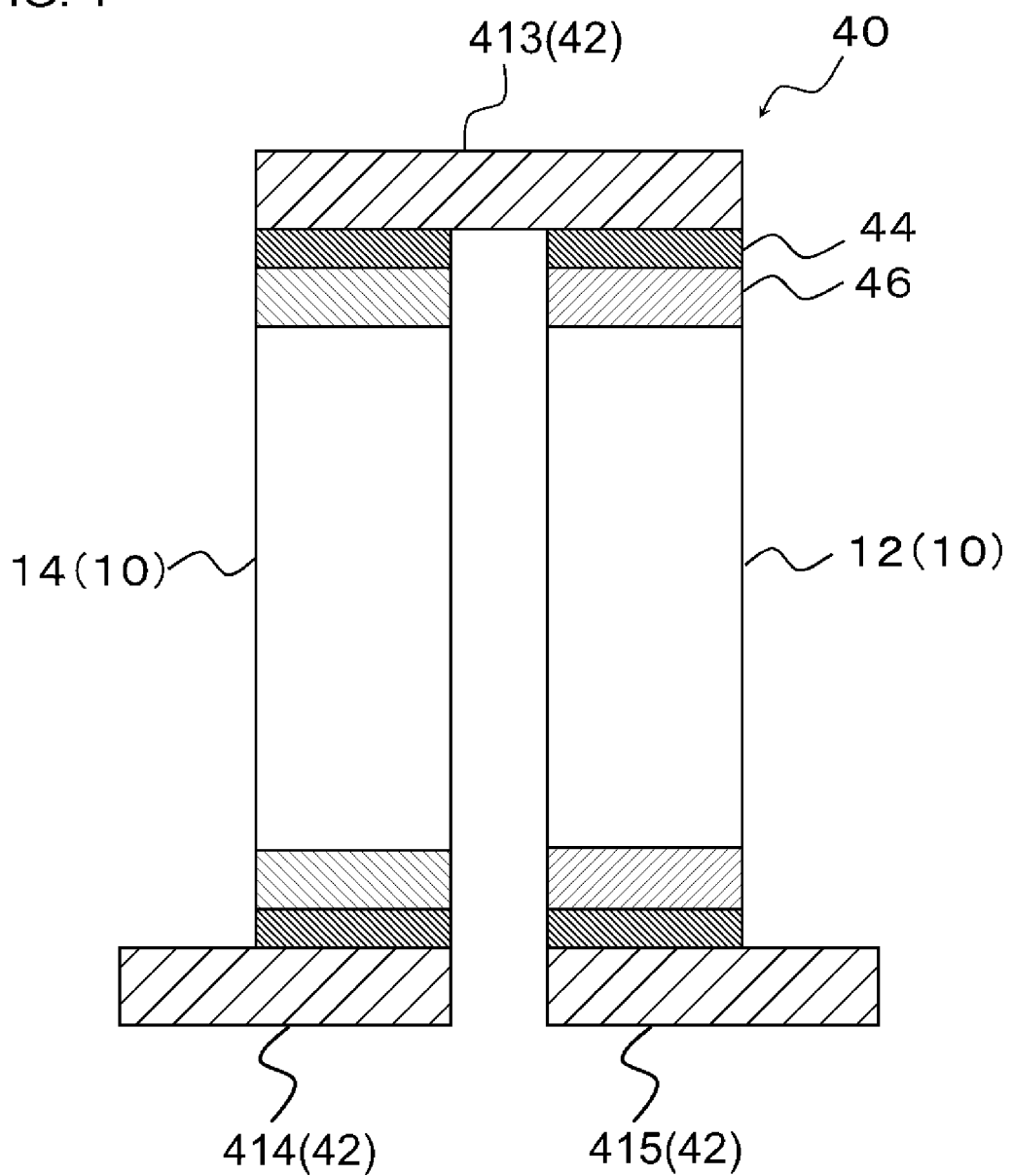
FIG. 1 is a view showing an example of a structure of a thermoelectric conversion device using a thermoelectric conversion material.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, an embodiment of the present invention will be described with reference to drawings. In all drawings, like reference numerals designate like constituent elements, and thus descriptions will not be repeated.

In one embodiment, there is provided a thermoelectric conversion material having a composition represented by General Formula $L_k R_r T_{t-m} M_m Sb_x$. Here, L includes at least one element selected from rare earth elements. R includes two or more elements selected from the group consisting of alkali metal elements, alkali earth metal elements, Group 4 elements, and Group 13 elements. T includes at least one element selected from Fe and Co. M includes at least one element selected from the group consisting of Ru, Os, Rh, Ir, Ni, Pd, Pt, Cu, Ag, and Au. In addition, $0.50 \leq k \leq 1.00$, $0.1 \leq r \leq 0.5$, $3.0 \leq t-m \leq 5.0$, $0 \leq m \leq 0.5$, $10.0 \leq x \leq 11.5$, and $x/t < 3.0$ are satisfied. Hereinafter, detailed descriptions will be provided.

Properties of the thermoelectric conversion material are evaluated with a figure of merit Z, for example. The figure of merit Z is represented by Equation (1) using a seebeck coefficient S, a thermal conductivity κ, and an electric resistivity ρ.

$$Z = S^2/(\kappa \rho) \quad \text{Equation (1)}$$

In addition, there is a case where properties of the thermoelectric conversion material are evaluated by multiplication of the figure of merit Z and a temperature T. In this case, Equation (2) is obtained by multiplying both sides of Equation (1) by a temperature T (here, T is an absolute temperature).

$$ZT = S^2 T/(\kappa \rho) \quad \text{Equation (2)}$$

ZT shown in Equation (2) is called a dimensionless figure of merit, and serves as a figure showing performance of the thermoelectric conversion material. As a value of the ZT becomes larger, the thermoelectric conversion performance of the thermoelectric conversion material at the temperature T becomes greater. From Equation (1) and Equation (2), an excellent thermoelectric conversion material is a material that can increase the value of the figure of merit Z, that is, a material having a high seebeck coefficient S and low thermal conductivity κ and electric resistivity ρ.

In addition, when evaluating performance of the thermoelectric conversion material from an electric viewpoint, there is a case where the performance is evaluated using a power factor P represented by Equation (3).

$$P = S^2/\rho \quad \text{Equation (3)}$$

A maximum conversion efficiency $\eta_{max}$ of the thermoelectric conversion material is represented by Equation (4).

$$\eta_{max} = \{(T_h - T_c)/T_h\} \{(M-1)/(M+(T_c/T_h))\} \quad \text{Equation (4)}$$

M of Equation (4) is represented by Equation (5). Here, $T_h$ is a temperature of a high temperature end of the thermoelectric conversion material and $T_c$ is a temperature of a low temperature end of the thermoelectric conversion material.

$$M = \{1 + Z(T_h + T_c)/2\}^{-0.5} \quad \text{Equation (5)}$$

From Equations (1) to (5), it is recognized that as the figure of merit and the difference between a temperature of a high temperature end and a temperature of a low temperature end become greater, the thermoelectric conversion efficiency of the thermoelectric conversion material is enhanced.

Figure 2:
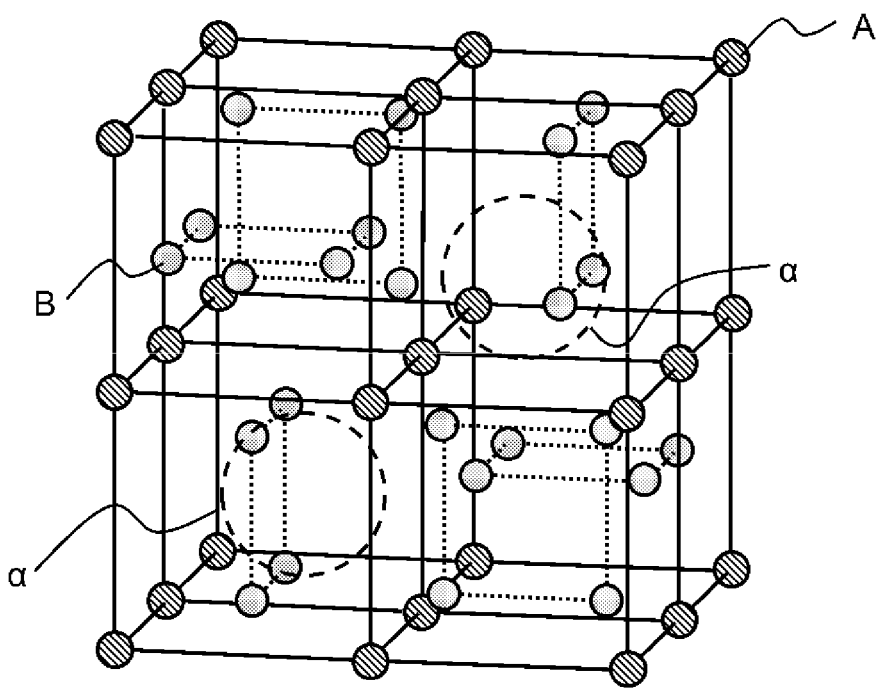
FIG. 2 is a view showing a crystal structure of a skutterudite compound.

FIG. 2 is a view showing a crystal structure of a skutterudite compound. The skutterudite compound is represented by General Formula of $T'X'_3$. Here, T' is transition metal such as Fe, Ru, Os, Co, Pd, and Pt, and is positioned on an A site in this figure. X' is a pnictogen element such as As, P, and Sb, and is positioned on a B site in this figure.

In this regard, in this figure, a structure in which metal elements such as rare earth elements are filled in a gap shown as α is called a filled skutterudite structure. A filled skutterudite compound is represented by General Formula of $R'T'_4 X'_{12}$, for example, and has a cubic crystal structure of a space group $Im^{-3}$. Here, R' which is a filling element includes alkali earth metal, a lanthanoide-based element, and an actinoid-based element.

The present inventors have performed elaborate studies on a thermoelectric conversion material including Sb and found that sublimation of Sb of the thermoelectric conversion material at a high temperature causes deterioration in thermoelectric conversion performance. In addition, the present inventors realized high thermoelectric conversion performance and heat resistance by using a plurality of types of filling elements including rare earth elements and by lowering a Sb content. In particular, high heat resistance is required for use in automobiles.

As described above, the thermoelectric conversion material according to the present embodiment has a composition represented by General Formula $L_k R_r T_{t-m} M_m Sb_x$. The thermoelectric conversion material may be an n-type thermoelectric conversion material, or a p-type thermoelectric conversion material. In general, since heat resistance is particularly low in the p-type thermoelectric conversion material in many cases, the composition according to the present embodiment is effective.

L includes at least one element selected from rare earth elements. Examples of rare earth elements include Sc, Y, La, Ce, Pr, Nd, Sm, Eu, Gd, Tb, Dy, Ho, Er, Tm, Yb, and Lu. L may include only one element, or may be a combination of two or more elements. L preferably includes at least one of La, Ce, and Pr. In addition, L is preferably La, Ce, or Pr.

k satisfies $0.50 \leq k \leq 1.00$. In addition, k preferably satisfies $0.55 \leq k$, and more preferably satisfies $0.60 \leq k$. On the other hand, k more preferably satisfies $k \leq 0.80$, and further more preferably satisfies $k \leq 0.70$. With this, it is possible to further enhance the thermoelectric conversion performance.

In addition, when L is La, k particularly preferably satisfies $0.60 \leq k \leq 0.65$. When L is Pr, k particularly preferably satisfies $0.60 \leq k \leq 0.70$. In addition, when L is Ce, k particularly preferably satisfies $0.65 \leq k \leq 0.70$. With this, it is possible to obtain heat resistance and high thermoelectric conversion performance.

R includes two or more elements selected from the group consisting of alkali metal elements, alkali earth metal elements, Group 4 elements, and Group 13 elements. By using a plurality of types of filling elements, it is possible to cause strong phonon scattering in crystals. Since this phonon scattering lowers the thermal conductivity κ, it is possible to increase the value of the dimensionless figure of merit ZT. Examples of the alkali metal elements include Li, Na, K, Rb, Cs, and Fr. Examples of the alkali earth metal elements include Ca, Sr, and Ba. Examples of the Group 4 elements include Ti, Zr, and Hf. Examples of the Group 13 elements include B, Al, Ga, In, and Tl. R more preferably includes three or more elements selected from the group consisting of the alkali metal elements, the alkali earth metal elements, the Group 4 elements, and the Group 13 elements. Among these, R preferably includes elements of three or more groups which are different from one another. However, R may include elements selected from the same group. In addition, R preferably includes three or more elements selected from the group consisting of the alkali earth metal elements, the Group 4 elements, and the Group 13 elements.

In addition, R preferably includes at least one of Ba, Ga, and Ti, and more preferably includes Ba, Ga, and Ti. For example, R may include Ba, Ga, and Ti.

An example of a combination of R and L is a combination of three or more elements mainly including any one of La, Ce, Ti, Zr, Hf, Al, Ga, and In in the p-type thermoelectric conversion material and mainly including any one of Yb, Ca, Sr, Ba, Al, Ga, and In in the n-type thermoelectric conversion material, for example. The main element is an element having the highest molar ratio among the elements constituting R and L.

r satisfies $0.1 \leq r \leq 0.5$. In addition, r preferably satisfies $0.15 \leq r$, and more preferably satisfies $0.2 \leq r$. On the other hand, r preferably satisfies $r \leq 0.4$, and more preferably satisfies $r \leq 0.3$.

T includes at least one element selected from Fe and Co. In addition, T preferably includes Fe and Co. By the thermoelectric conversion material including both Fe and Co, a lattice thermal conductivity can be lowered and the thermoelectric conversion performance can further be enhanced. When T includes Fe and Co, a molar ratio of Co to Fe is preferably 0.1 or greater, and more preferably 0.2 or greater, and further more preferably 0.25 or greater. On the other hand, a molar ratio of Fe to Co is preferably 1.0 or less, more preferably 0.5 or less, and further more preferably 0.35 or less.

$t-m$ satisfies $3.0 \leq t-m \leq 5.0$. In addition, $t-m$ preferably satisfies $3.5 \leq t-m$. On the other hand, $t-m$ more preferably satisfies $t-m \leq 4.5$.

t satisfies $3.0 \leq t \leq 5.5$. In addition, t preferably satisfies $3.5 \leq t$. On the other hand, t preferably satisfies $t \leq 5.0$, and more preferably satisfies $t \leq 4.5$.

m satisfies $0 \leq m \leq 0.5$. In addition, m preferably satisfies $m \leq 0.3$, and more preferably satisfies $m \leq 0.1$. In addition, m may satisfies $m=0$.

M includes at least one element selected from the group consisting of Ru, Os, Rh, Ir, Ni, Pd, Pt, Cu, Ag, and Au. M enters the A site in FIG. 2 and causes distortion of crystal lattices. In addition, it is possible to lower the thermal conductivity κ and it is possible to further increase the value of the dimensionless figure of merit ZT.

x satisfies $10.0 \leq x \leq 11.5$. In addition, x preferably satisfies $10.5 \leq x$, and more preferably satisfies $10.75 \leq x$. On the other hand, x more preferably satisfies $x \leq 11.25$.

A value represented by $x/t$ satisfies $x/t<3.0$. The case where the value satisfies $x/t<3.0$ shows that a Sb content is lower than that of a general skutterudite structure. In addition, $x/t$ preferably satisfies $x/t$ 2.90, more preferably satisfies $x/t \leq 2.85$, and further more preferably satisfies $x/t \leq 2.80$. On the other hand, $x/t$ satisfies $1.8<x/t$, for example, and preferably satisfies $2.50 \leq x/t$.

In addition, a value represented by $x/(k+r+t)$ preferably satisfies $x/(k+r+t)<2.40$. The case where $x/(k+r+t)<2.40$ shows that a Sb content is low. In addition, a value represented by $x/(k+r+t)$ more preferably satisfies $x/(k+r+t) \leq 2.30$, and further more preferably satisfies $x/(k+r+t) \leq 2.25$. On the other hand, $x/(k+r+t)$ satisfies $1.50<x/(k+r+t)$, for example, and preferably satisfies $2.00 \leq x/(k+r+t)$.

A major phase of the thermoelectric conversion material according to the present embodiment has a filled skutterudite structure. Here, the major phase is a phase accounting for the largest part of the thermoelectric conversion material. In addition, in a case where the thermoelectric conversion material includes only one phase, the phase is referred to as the major phase. The ratio between the phases constituting the thermoelectric conversion material is obtained by an X-ray diffraction method or a method for analysis of a structure image such as SEM, for example. Although a proportion accounted for by the major phase in the thermoelectric conversion material is not particularly limited, the proportion is 40% by volume or more, for example, preferably 50% by volume or more, and more preferably 60% by volume or more.

In addition, the thermoelectric conversion material may include a first phase and a second phase. Here, the first phase and the second phase are phases different from each other. The first phase is the major phase described above. In addition, a proportion accounted for by the second phase in all of the thermoelectric conversion material is preferably 0.1% by volume or more, for example. On the other hand, a proportion accounted for by the first phase in all of the thermoelectric conversion material is preferably 60% by volume or more, preferably 70% by volume or more, and more preferably 80% by volume or more. On the other hand, the proportion accounted for by the second phase is preferably 40% by volume or less, and more preferably 20% by volume or less.

In addition to the above-described elements, the thermoelectric conversion material may include inevitably contained oxygen or impurity elements.

Although a maximum value of the dimensionless figure of merit ZT of the thermoelectric conversion material according to the present embodiment in a temperature range of 100° C. to 600° C. is not particularly limited, the value can be 0.60 or more, for example. In addition, the maximum value of the dimensionless figure of merit ZT of the thermoelectric conversion material in a temperature range of 100° C. to 600° C. is preferably 0.65 or more. Here, in a thermoelectric conversion material including a high proportion of Sb as in a general skutterudite structure, there is a case where, due to use at a high temperature, Sb sublimates and the content is lowered. However, in this case, the dimensionless figure of merit ZT is also lowered. The thermoelectric conversion material according to the present embodiment can achieve both high thermoelectric conversion performance and heat resistance by the growth of crystals with a predetermined composition.

Next, descriptions will be provided on a method of manufacturing the thermoelectric conversion material according to the present embodiment. The thermoelectric conversion material according to the present embodiment can be formed by eutectic reaction, eutectoid reaction, peritectic reaction, peritectoid reaction, monotectic reaction, segregation reaction, decomposition of a phase of a substance in a non-equilibrium state, decomposition of a solid solution, and composite processes thereof. For this reason, the thermoelectric conversion material can be manufactured by appropriately combining a dissolution method, a rapid solidification method (gas atomization, water atomization, single roll method, twin roll method), a mechanical alloying method, a ball mill method, a beads mill method, a hot press method, a heating and sintering method, spark plasma sintering method, a heat treatment method, or the like, for example.

Hereinafter, descriptions will be provided on the method of manufacturing a thermoelectric conversion material with reference to three examples of (i) to (iii). For example, by employing the following aspects, even in a case of including many elements, it is possible to obtain a thermoelectric conversion material with a predetermined composition, with favorable accuracy.

(i) As a method of manufacturing the thermoelectric conversion material according to the present embodiment, an example in which the dissolution method and the heat treatment method are combined is described. A simple substance (for example, pure metal) raw material at a predetermined ratio is put into a crucible, heated, for example, to a temperature of 1,000° C. to 1,250° C. and dissolved by electric furnace heating in an inert gas atmosphere, and held for 5 hours. Examples of the inert gas include Ar gas or $N_2$ gas. Next, in order to ensure uniformity of the composition, the material is rapidly cooled to room temperature. After that, the material is heated again to 600° C., held for 12 hours in a solid phase state, and cooled to room temperature, and thereby the targeted thermoelectric conversion material can be obtained.

(ii) As a method of manufacturing the thermoelectric conversion material according to the present embodiment, an example in which the dissolution method and the spark plasma sintering method are combined is described. A simple substance raw material at a predetermined ratio is put into a crucible, heated, for example, to a temperature of 1,000° C. to 1,250° C. and dissolved in an inert gas atmosphere, held for 5 hours, and then rapidly cooled with water. The material rapidly cooled with water is pulverized, and the powders are put into a carbon dice and heated to a temperature of 500° C. to 750° C. while applying pulse current under a pressure of 5 MPa to 60 MPa in a vacuum or inert gas atmosphere. After the material is held for 10 minutes as it is, the material is cooled to room temperature, and thereby the targeted thermoelectric conversion material can be obtained.

(iii) As a method of synthesizing the thermoelectric conversion material according to the present embodiment, an example in which the mechanical alloying method and the spark plasma sintering method are combined is described. First, pure metal powders at a predetermined ratio are put into an alumina container, and mixed with alumina balls in an inert gas atmosphere. Next, mechanical alloying is performed for 24 hours to obtain raw material powders. The powders are put into a carbon dice, heated to a temperature of 500° C. to 750° C. while applying pulse current under a pressure of 5 MPa to 60 MPa in a vacuum or inert gas atmosphere, and held for 10 minutes. After that, the material is cooled to room temperature, and thereby the targeted thermoelectric conversion material can be obtained.

FIG. 1 is a view showing an example of a structure of a thermoelectric conversion device 40 using a thermoelectric conversion material 10. The thermoelectric conversion device 40 includes the thermoelectric conversion material 10 and electrodes 42. Hereinafter, detailed descriptions will be provided.

The thermoelectric conversion device 40 according to the present embodiment includes at least one n-type thermoelectric conversion material 12 and one p-type thermoelectric conversion material 14 as the thermoelectric conversion material 10. The thermoelectric conversion device 40 further includes a plurality of electrodes 42, bonding members 44, and diffusion prevention members 46. In the thermoelectric conversion device 40, one or more pairs of the n-type thermoelectric conversion material 12 and the p-type thermoelectric conversion material 14 combined together are electrically connected in series. By using the thermoelectric conversion device 40, it is possible to directly convert heat energy into electric energy, or it is possible to directly convert electric energy into heat energy.

The thermoelectric conversion device 40 includes a first electrode 413 which electrically connects one end of the p-type thermoelectric conversion material 14 and one end of the n-type thermoelectric conversion material 12 to each other, a second electrode 414 which is connected to the other end of the p-type thermoelectric conversion material 14, and a third electrode 415 which is connected to the other end of the n-type thermoelectric conversion material 12, as the electrodes 42.

The n-type thermoelectric conversion material 12 and the p-type thermoelectric conversion material 14 are each bonded to the electrodes 42 via the bonding members 44 and the diffusion prevention members 46. Each bonding member 44 and each diffusion prevention member 46 are provided by being stacked between the thermoelectric conversion material 10 and each electrode 42. The bonding member 44 is bonded to the electrode 42, and the diffusion prevention member 46 is bonded to the thermoelectric conversion material 10.

Although the electrode 42 is not particularly limited, the electrode 42 preferably includes at least one type of alloy selected from the group consisting of a Fe alloy, a Co alloy, a Ni alloy, a Cu alloy, a Ti alloy, and an Al alloy. The electrode 42 may be at least one metal selected from the group consisting of iron, cobalt, nickel, copper, titanium, and aluminum, for example. The material of the electrode 42 may be more preferably an alloy having the same composition as an alloy layer of the bonding member 44. With this, it is possible to enhance adhesion between the electrode 42 and the bonding member 44.

The bonding member 44 preferably includes at least one type of alloy selected from the group consisting of a Cu alloy, an Ag alloy, an Au alloy, and an Al alloy, from a viewpoint of mitigating thermal stress.

The diffusion prevention member preferably includes at least one type of alloy selected from the group consisting of a Fe-M1 (M1 is at least one element selected from the group consisting of Cr, Mo, W, V, Nb, Ta, Mn, Ti, Zr, Hf, C, Si, and Ge) alloy, a Co-M1 alloy, a Ni-M1 alloy, a Ti-M2 (M2 is at least one element selected from the group consisting of Al, Ga, In, Cu, Ag, Au, Sn, Zn, and Mg), a Zr-M2 alloy, a Hf-M2 alloy, a V-M2 alloy, a Nb-M2 alloy, a Ta-M2 alloy, a Cr-M2 alloy, a Mo-M2 alloy, and a W-M2 alloy, from a viewpoint of preventing diffusion of elements constituting the thermoelectric conversion material 10.

Each of the bonding member 44 and the diffusion prevention member 46 may include one type of alloy layer, or may include two or more types of alloy layers.

Each of the diffusion prevention member 46 and the bonding member 44 can be stacked on the thermoelectric conversion material 10 by a method such as brazing, sputtering, vapor deposition, thermal spraying, or a spark plasma sintering method.

The electrode 42 can be stacked on the bonding member 44 by a known method such as brazing, sputtering, vapor deposition, thermal spraying, a spark plasma sintering method, a microlaser welding, and the like.

In the present embodiment, descriptions are provided on the thermoelectric conversion device 40 having the bonding members 44 and the diffusion prevention members 46, but either the bonding members 44 or the diffusion prevention members 46 can be skipped, or both of the bonding members 44 and the diffusion prevention members 46 can be skipped.

Next, descriptions will be provided on operations and effects of the present embodiment. According to the present embodiment, it is possible to obtain a thermoelectric conversion material excellent in heat resistance by setting a specific composition. In addition, it is possible to achieve high thermoelectric conversion performance by setting magnitudes of k, r, t, m, and x to satisfy predetermined conditions.

Hereinafter, detailed descriptions will be provided on the present embodiment with reference to examples. The present embodiment is not limited to the descriptions on the examples.

[Manufacturing of Thermoelectric Conversion Material]

Descriptions will be provided on methods of manufacturing thermoelectric conversion materials of examples and comparative examples. First, pure metal of raw materials of the elements constituting the thermoelectric conversion material was put into a carbon crucible at a predetermined ratio corresponding to a composition ratio shown in General Formula, heated to 1,200° C. by electric furnace heating and dissolved in an Ar gas atmosphere, and held for 5 hours, and then rapidly cooled with water. Next, the material rapidly cooled with water was pulverized, and the powders were put into a carbon dice and heated under a pressure of 40 MPa in the Ar gas atmosphere. After the powders were held for 10 minutes in a temperature range of 600° C. to 750° C., the powders were cooled to room temperature, and thereby the targeted thermoelectric conversion material was obtained. The composition of the obtained thermoelectric conversion material was measured by an Inductively Coupled Plasma (ICP) analysis.

The thermoelectric conversion materials having the compositions shown in the following were produced and the heat resistance was evaluated.

EXAMPLE 1-1 p-type $La_{0.65}Ba_{0.01}Ga_{0.1}Ti_{0.1}Fe_3Co_1Sb_{11}$

EXAMPLE 1-2 p-type $Pr_{0.7}Ba_{0.01}Ga_{0.1}Ti_{0.1}Fe_3Co_1Sb_{11}$

COMPARATIVE EXAMPLE 1-1 p-type $La_{0.7}Ba_{0.01}Ga_{0.1}Ti_{0.1}Fe_3Co_1Sb_{12}$

The evaluation of heat resistance was performed by thermogravimetric measurement. Specifically, thermogravity of the thermoelectric material powders were measured by using a thermogravimetric measurement device in a temperature range of room temperature to 750° C. at a heating speed of 5° C./min in the Ar gas atmosphere.

Figure 3:
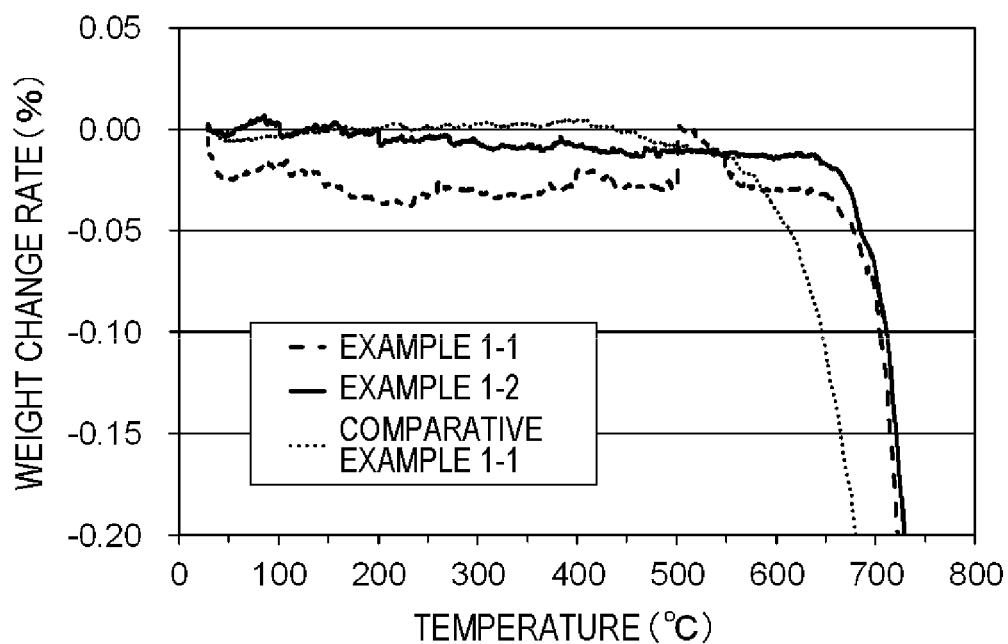
FIG. 3 is a graph showing results of thermogravimetric measurement (TG chart) of thermoelectric conversion materials of Example 1-1, Example 1-2, and Comparative Example 1-1.

FIG. 3 is a graph showing results of thermogravimetric measurement (TG chart) of thermoelectric conversion materials of Example 1-1, Example 1-2, and Comparative Example 1-1. In Comparative Example 1-1, reduction in weight occurred due to sublimation of Sb at about 550° C. In Example 1-1 and Example 1-2, reduction in weight did not occur until the temperature exceeded 600° C. It was confirmed that the thermoelectric conversion materials of Example 1-1 and Example 1-2 have heat resistance higher than the thermoelectric conversion material of Comparative Example 1-1.

In addition, as Example 2-1 to Example 2-6, Comparative Example 2-1, and Comparative Example 2-2, p-type thermoelectric conversion materials shown in the following were produced. Here, Example 2-2 corresponds to Example 1-1, and Comparative Example 2-1 corresponds to Comparative Example 1-1.

EXAMPLE 2-1 p-type $La_{0.6}Ba_{0.01}Ga_{0.1}Ti_{0.1}Fe_3Co_1Sb_{11}$

EXAMPLE 2-2 p-type $La_{0.65}Ba_{0.01}Ga_{0.1}Ti_{0.1}Fe_3Co_1Sb_{11}$

EXAMPLE 2-3 p-type $La_{0.8}Ba_{0.01}Ga_{0.1}Ti_{0.1}Fe_3Co_1Sb_{11}$

EXAMPLE 2-4 p-type $La_{0.9}Ba_{0.01}Ga_{0.1}Ti_{0.1}Fe_3Co_1Sb_{11}$

EXAMPLE 2-5 p-type $La_{0.75}Ba_{0.01}Ga_{0.1}Ti_{0.1}Fe_{2.75}Co_{1.25}Sb_{11}$

EXAMPLE 2-6 p-type $La_{0.75}Ba_{0.01}Ga_{0.1}Ti_{0.1}Fe_{2.75}Co_{1.25}Sb_{10}$

COMPARATIVE EXAMPLE 2-1 p-type $La_{0.70}Ba_{0.01}Ga_{0.1}Ti_{0.1}Fe_3Co_1Sb_{12}$

COMPARATIVE EXAMPLE 2-2 p-type $La_{0.75}Ba_{0.01}Ga_{0.1}Ti_{0.1}Fe_{2.75}Co_{1.25}Sb_{12}$

Regarding the thermoelectric conversion materials of Example 2-1 to Example 2-6, Comparative Example 2-1, and Comparative Example 2-2, the evaluation of heat resistance was performed as in Example 1-1 and the like. In addition, thermoelectric conversion performance and the like of the thermoelectric conversion material of each of Examples and each of Comparative Examples were evaluated as follows.

[Evaluation of Thermoelectric Conversion Performance]

Evaluation of thermoelectric conversion performance was performed as follows.

Regarding a thermoelectric conversion material of each of Examples and each of Comparative Examples, a seebeck coefficient S, an electric resistivity $\rho$, and a thermal conductivity $\kappa$ were measured in a temperature range of 100° C. to 600° C., and each of a power factor P and a dimensionless figure of merit ZT was calculated. Specifically, a prism-shaped sample piece of the thermoelectric conversion material was subjected to measurement of the seebeck coefficient S and the electric resistivity $\rho$ using a thermoelectric performance measuring device (ZEM-2 manufactured by Ulvac-Riko, Inc.). At this time, the prism-shaped sample piece was in a prism shape having a dimension of 1×w×h, with 1 being 2 to 3 mm, w being 2 to 3 mm, and h being 10 to 20 mm. In addition, a disc-shaped sample piece of the thermoelectric conversion material was subjected to measurement of a density d using a density meter at room temperature, and to measurement of a thermal diffusivity $\alpha$ at each temperature using a laser flash method thermal constant measuring device (TC-7000H manufactured by Ulvac-Riko, Inc.). Moreover, a specific heat $C_p$ of the thermoelectric conversion material was measured in a temperature range of 100° C. to 600° C. using a thermal analysis device of differential scanning calorimetry. Using the measured density d, the specific heat $C_p$, and the thermal diffusivity $\alpha$, the thermal conductivity $\kappa$ was obtained from a relation of $\kappa = \alpha \times d \times C_p$. In addition, the dimensionless figure of merit ZT was calculated using Equation (2) described in the present embodiment and the power factor P was calculated using Equation (3).

Figure 4:
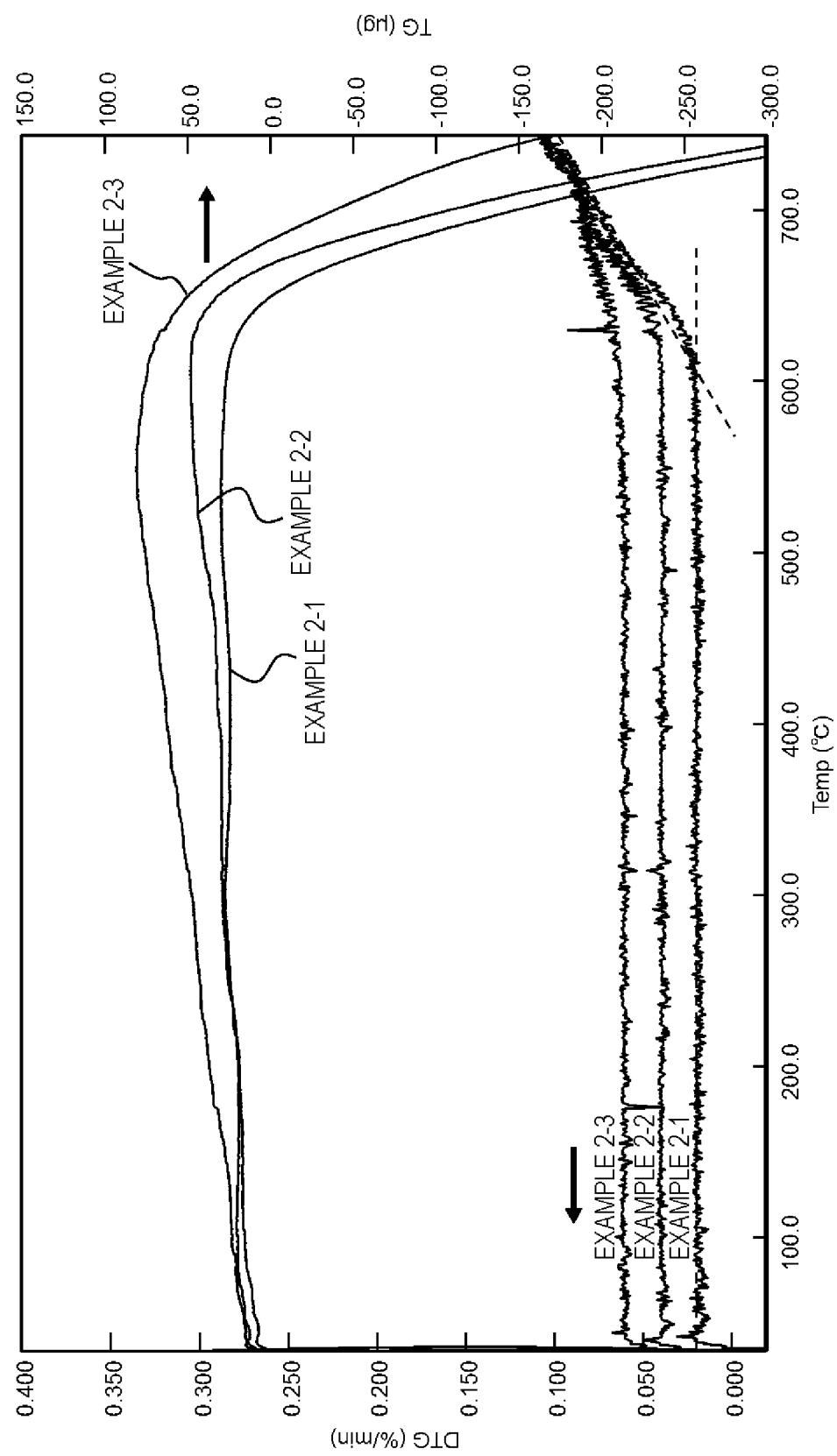
FIG. 4 is a graph showing results of thermogravimetric measurement of thermoelectric conversion materials of Example 2-1 to Example 2-3.

FIG. 4 is a graph showing results of thermogravimetric measurement of thermoelectric conversion materials of Example 2-1 to Example 2-3. In all of the thermoelectric conversion materials of Example 2-1 to Example 2-3, reduction in weight due to sublimation of Sb did not occur until the temperature reached about 600° C. or higher. Therefore, it was ascertained that the thermoelectric conversion materials have high heat resistance.

Figure 5A:
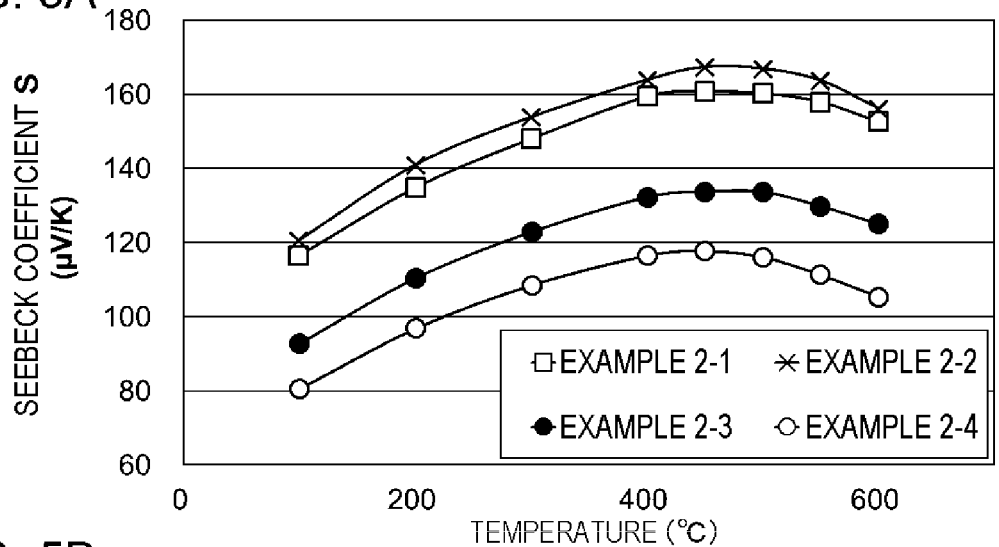
FIG. 5A is a graph showing seebeck coefficients S of Example 2-1 to Example 2-4.
Figure 5B:
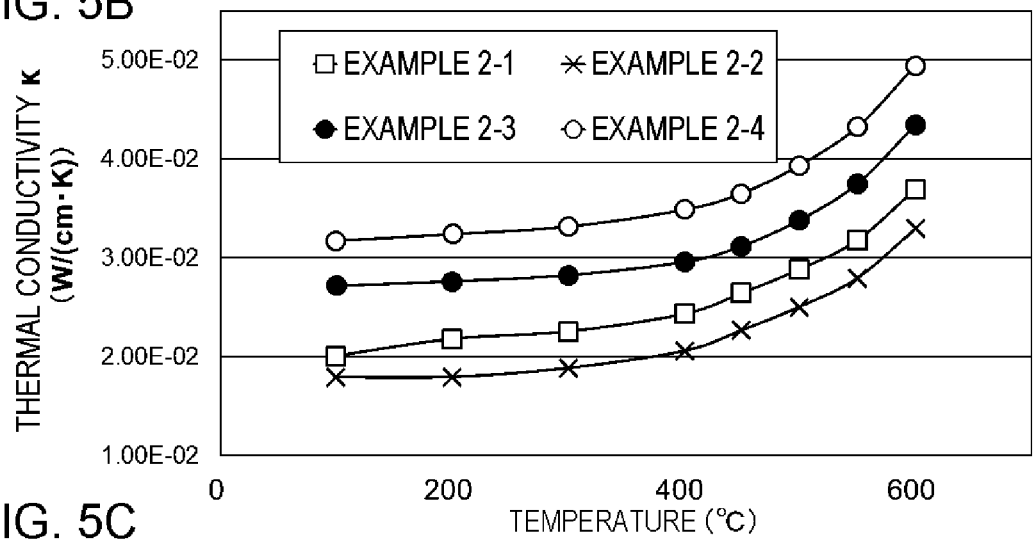
FIG. 5B is a graph showing thermal conductivities K of Example 2-1 to Example 2-4.
Figure 5C:
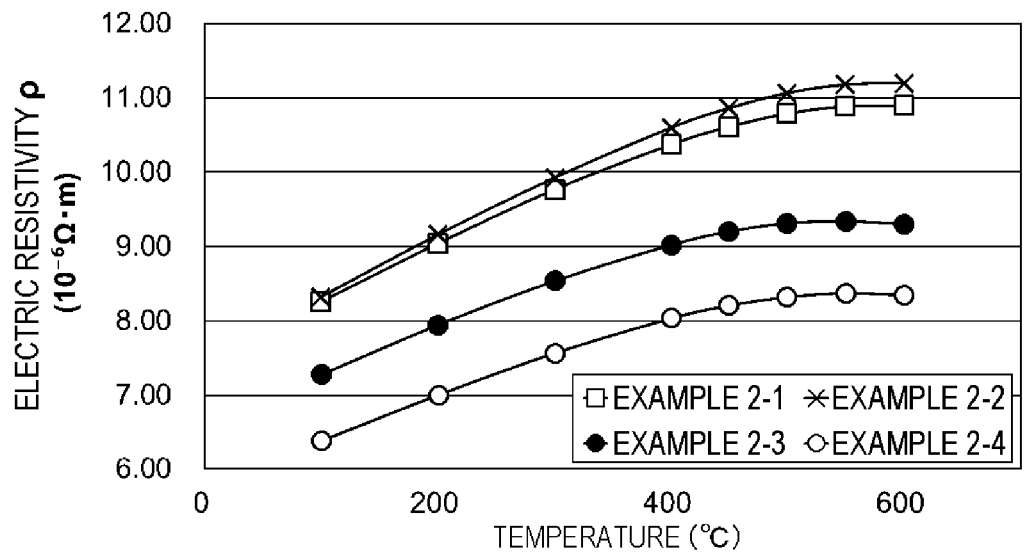
FIG. 5C is a graph showing electric resistivities p of Example 2-1 to Example 2-4.
Figure 6A:
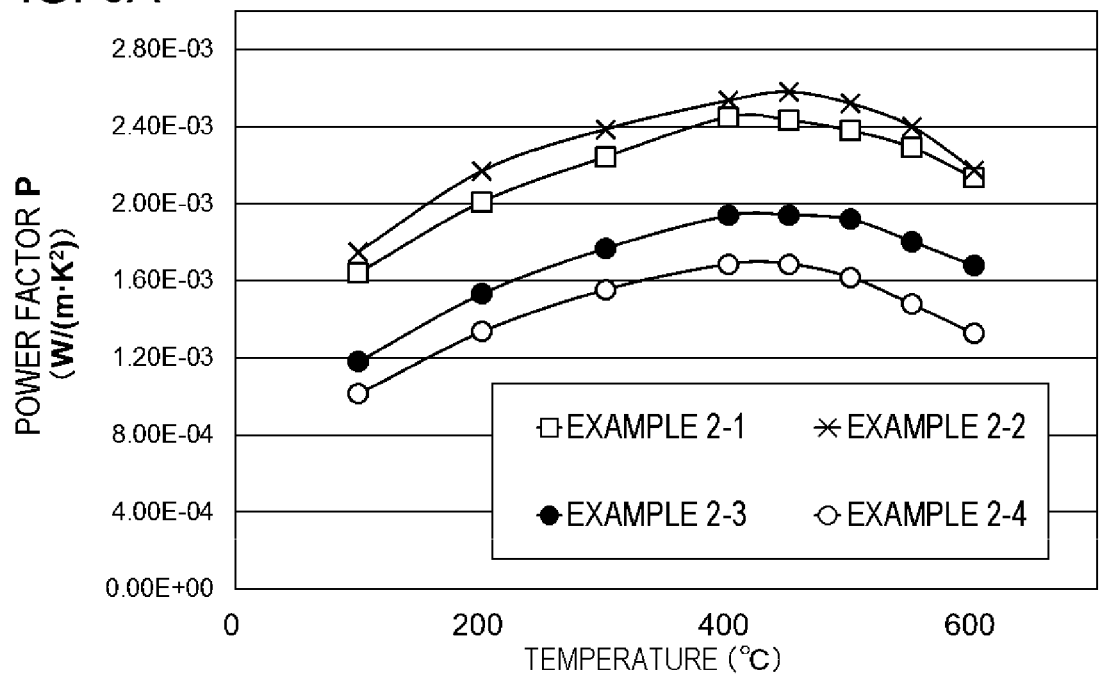
FIG. 6A is a graph showing power factors P of Example 2-1 to Example 2-4.
Figure 6B:
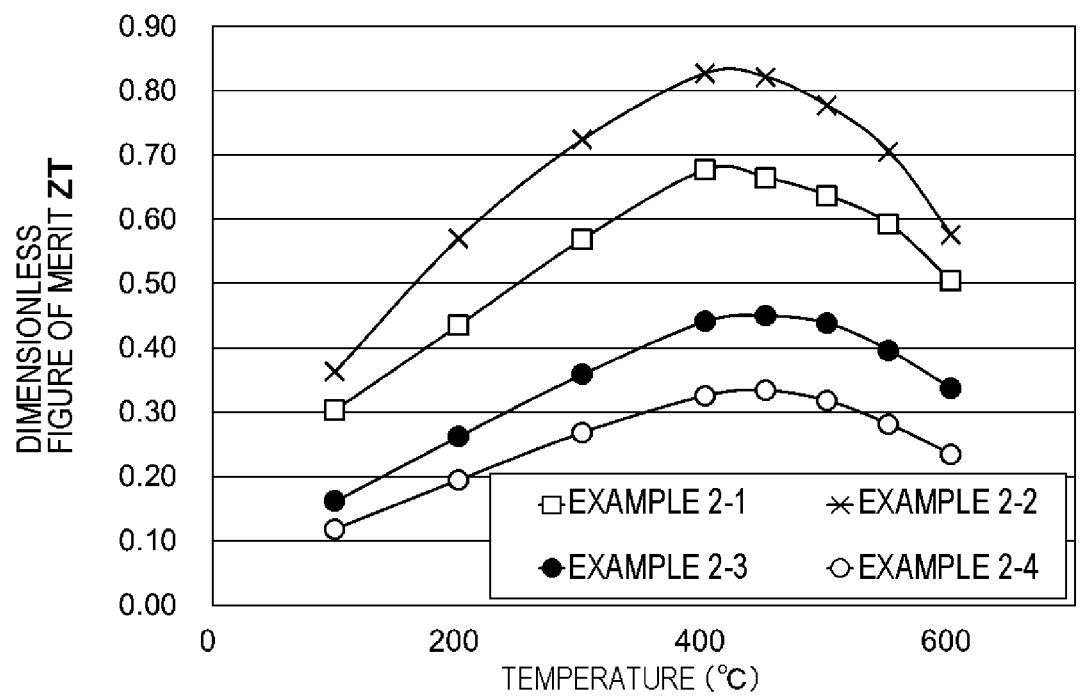
FIG. 6B is a graph showing dimensionless figures of merit ZT of Example 2-1 to Example 2-4.

FIG. 5A is a graph showing seebeck coefficients S of Example 2-1 to Example 2-4, FIG. 5B is a graph showing thermal conductivities K of Example 2-1 to Example 2-4, and FIG. 5C is a graph showing electric resistivities ρ of Example 2-1 to Example 2-4. FIG. 6A is a graph showing power factors P of Example 2-1 to Example 2-4, and FIG. 6B is a graph showing dimensionless figures of merit ZT of Example 2-1 to Example 2-4.

Table 1 collectively shows a molar ratio of each element, a value of x/t, a value of x/(k+r+t), a heat-resistant temperature $T_L$, and a maximum value $ZT_{max}$ of a dimensionless figure of merit in a temperature range of 100° C. to 600° C. From the results shown in Table 1, it was ascertained that in each example, the thermoelectric conversion material has a higher heat-resistant temperature $T_L$ and more excellent heat resistance than in Comparative Example 2-1 and Comparative Example 2-2.

FeSb. From this figure, it is recognized that crystal phases of $FeSb_2$ and FeSb are the smallest in Example 2-2.

Figure 9A:
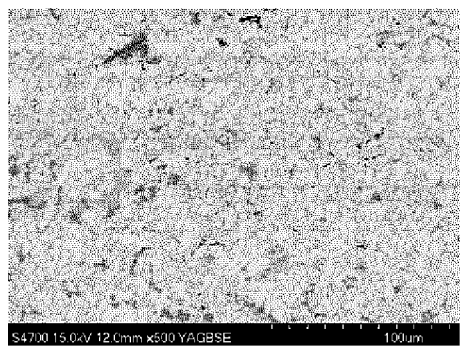
FIG. 9A is a view showing a result obtained by observing a section of the thermoelectric conversion material related to Example 2-1 using an electron microscope.
Figure 9C:
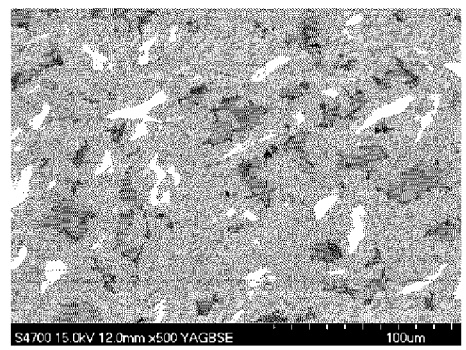
FIG. 9C is a view showing a result obtained by observing a section of the thermoelectric conversion material related to Example 2-3 using an electron microscope.
Figure 9B:
FIG. 9B is a view showing a result obtained by observing a section of the thermoelectric conversion material related to Example 2-2 using an electron microscope.
Figure 9D:
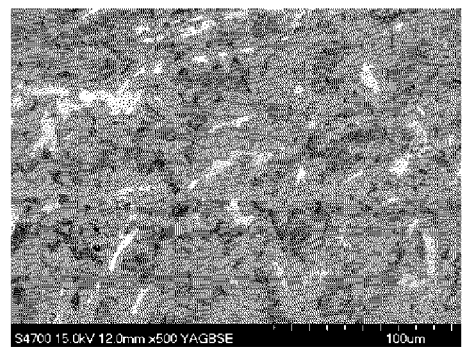
FIG. 9D is a view showing a result obtained by observing a section of the thermoelectric conversion material related to Example 2-4 using an electron microscope.

In addition, FIG. 9A is a view showing a result obtained by observing a section of the thermoelectric conversion material related to Example 2-1 using an electron microscope. FIG. 9B is a view showing a result obtained by observing a section of the thermoelectric conversion material related to Example 2-2 using an electron microscope. FIG. 9C is a view showing a result obtained by observing a section of the thermoelectric conversion material related to Example 2-3 using an electron microscope. FIG. 9D is a view showing a result obtained by observing a section of the thermoelectric conversion material related to Example 2-4 using an electron microscope.

In FIG. 9A to FIG. 9D, relatively black portions indicate portions where phases of FeSb, $FeSb_2$, or the like are mainly generated. On the other hand, relatively white portions indicate portions where phases having a high La content are mainly generated. Portions other than these indicate portions where skutterudite phases are generated. From these figures, it is recognized that the generation of different phases such as the phases of FeSb, $FeSb_2$, or the like and the phases having a high La content is low particularly in Example 2-1 and Example 2-2, in which high $ZT_{max}$ values are obtained. In addition, it is recognized that the generation of different

TABLE 1

|  | La | Ba | Ga | Ti | Fe | Co | Sb | x/t | x/(k + r + t) | $T_L$ | $ZT_{max}$ |
|---|---|---|---|---|---|---|---|---|---|---|---|
| Example 2-1 | 0.60 | 0.01 | 0.1 | 0.1 | 3.00 | 1.00 | 11.00 | 2.75 | 2.29 | 602 | 0.68 |
| Example 2-2 | 0.65 | 0.01 | 0.1 | 0.1 | 3.00 | 1.00 | 11.00 | 2.75 | 2.26 | 621 | 0.82 |
| Example 2-3 | 0.80 | 0.01 | 0.1 | 0.1 | 3.00 | 1.00 | 11.00 | 2.75 | 2.20 | 568 | 0.45 |
| Example 2-4 | 0.90 | 0.01 | 0.1 | 0.1 | 3.00 | 1.00 | 11.00 | 2.75 | 2.15 | 572 | 0.33 |
| Example 2-5 | 0.75 | 0.01 | 0.1 | 0.1 | 2.75 | 1.25 | 11.00 | 2.75 | 2.22 | 614 | 0.47 |
| Example 2-6 | 0.75 | 0.01 | 0.1 | 0.1 | 2.75 | 1.25 | 10.00 | 2.50 | 2.02 | 640 | 0.24 |
| Comparative Example 2-1 | 0.70 | 0.01 | 0.1 | 0.1 | 3.00 | 1.00 | 12.00 | 3.00 | 2.44 | 560 | 0.72 |
| Comparative Example 2-2 | 0.75 | 0.01 | 0.1 | 0.1 | 2.75 | 1.25 | 12.00 | 3.00 | 2.42 | 558 | 0.75 |

Here, the temperature at which an intersection point of two straight lines (for example, broken lines in FIG. 4) extrapolating portions around which reduction in weight starts, of a differential thermogravimetry (DTG) curve obtained by differentiating a relation between the thermogravimetry obtained by thermogravimetric measurement and temperature/time was set as the heat-resistant temperature $T_L$.

Figure 7:
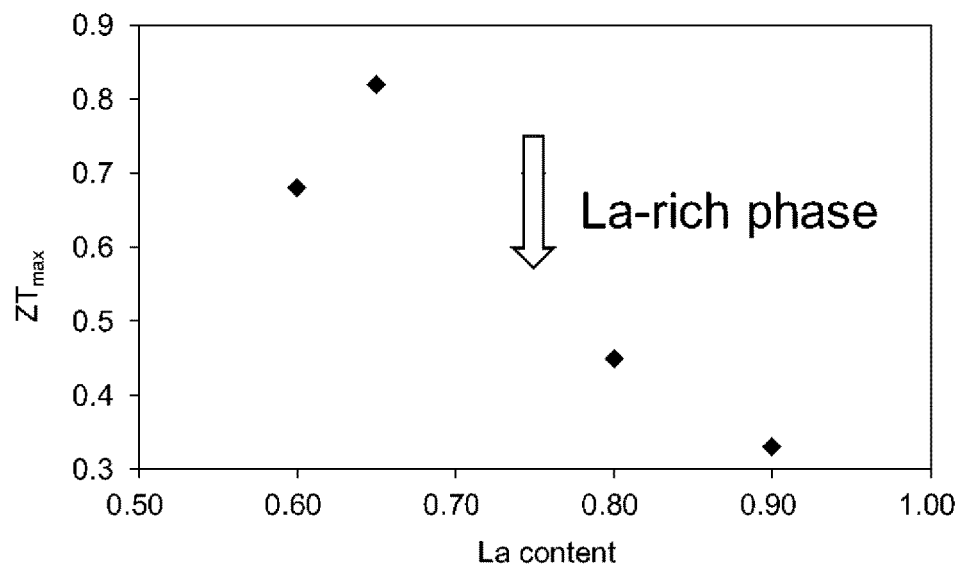
FIG. 7 is a graph showing plotting of maximum values $ZT_{max}$ of dimensionless figures of merit of Example 2-1 to Example 2-4 in a temperature range of 100° C. to 600° C.

In addition, FIG. 7 is a graph showing plotting of maximum values $ZT_{max}$ of dimensionless figures of merit of Example 2-1 to Example 2-4 in a temperature range of 100° C. to 600° C. The axis of abscissas of this figure shows a La content (value of k in the embodiment), and the axis of ordinates shows a maximum value $ZT_{max}$ of a dimensionless figure of merit in a temperature range of 100° C. to 600° C. As shown in FIG. 7, ZT was particularly high in a case where the value of k described in the embodiment satisfied 0.50≤k≤0.70, and $ZT_{max}$ was the highest in Example 2-2 in which k satisfied k=0.65. On the other hand, when k exceeded 0.70, the value of $ZT_{max}$ was dramatically decreased. These points are considered in the following.

Figure 8:
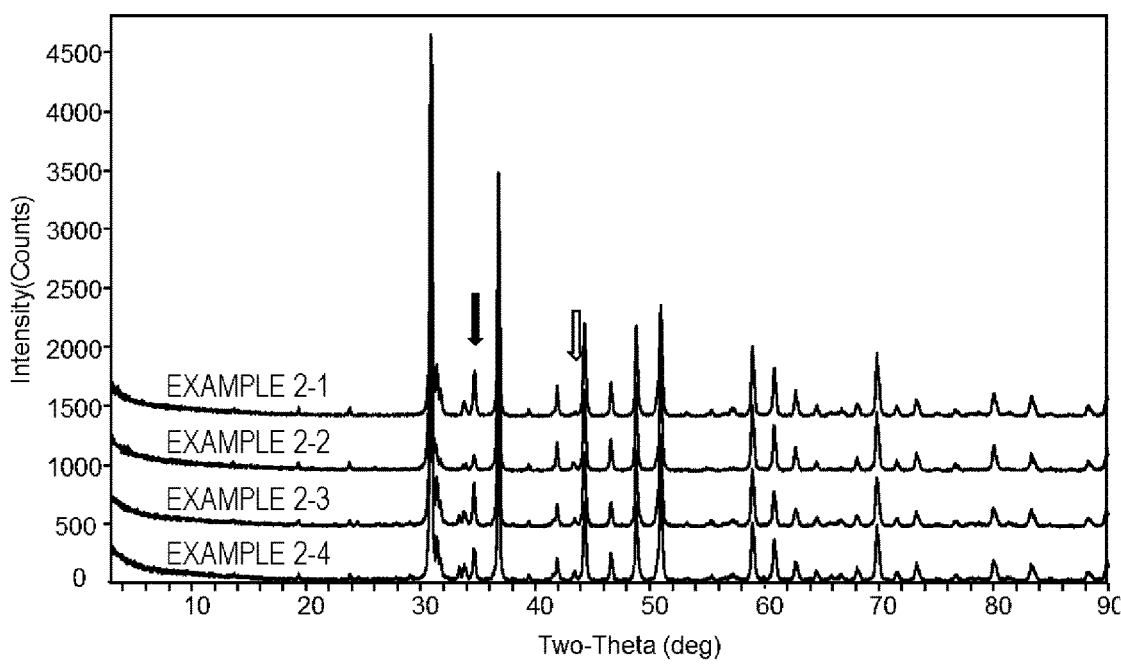
FIG. 8 is a graph showing results of evaluation of thermoelectric conversion materials related to Example 2-1 to Example 2-4 using an X-ray diffraction method.

FIG. 8 is a graph showing results of evaluation of thermoelectric conversion materials related to Example 2-1 to Example 2-4 using an X-ray diffraction method. In this figure, the black arrow shows positions of peaks resulting from crystal phases of $FeSb_2$. In addition, the white arrow shows positions of peaks resulting from crystal phases of phases is the lowest in Example 2-2, which is the closest to the skutterudite single phase. On the other hand, it is recognized that the generation of phases having a high La content is high in Example 2-3 and Example 2-4. Therefore, it is considered that a decrease of a value of $ZT_{max}$ in a case where k exceeds 0.70 is due to the generation of phases having a high La content.

In addition, as Examples 3-1 to 3-5, and Comparative Example 3-1, p-type thermoelectric conversion materials shown in the following were produced. Here, Example 3-3 corresponds to Example 1-2.

EXAMPLE 3-1 p-type $Pr_{0.6}Ba_{0.01}Ga_{0.1}Ti_{0.1}Fe_3Co_1Sb_{11}$

EXAMPLE 3-2 p-type $Pr_{0.65}Ba_{0.01}Ga_{0.1}Ti_{0.1}Fe_3Co_1Sb_{11}$

EXAMPLE 3-3 p-type $Pr_{0.7}Ba_{0.01}Ga_{0.1}Ti_{0.1}Fe_3Co_1Sb_{11}$

EXAMPLE 3-4 p-type $Pr_{0.8}Ba_{0.01}Ga_{0.1}Ti_{0.1}Fe_3Co_1Sb_{11}$

EXAMPLE 3-5 p-type $Pr_{0.9}Ba_{0.01}Ga_{0.1}Ti_{0.1}Fe_3Co_1Sb_{11}$

COMPARATIVE EXAMPLE 3-1 p-type $Pr_{0.75}Ba_{0.01}Ga_{0.1}Ti_{0.1}Fe_3Co_1Sb_{12}$

Regarding the thermoelectric conversion materials of Example 3-1 to Example 3-5, and Comparative Example 3-1, the evaluation of thermoelectric conversion performance and heat resistance were performed as in Example 2-1 and the like.

Figure 10A:
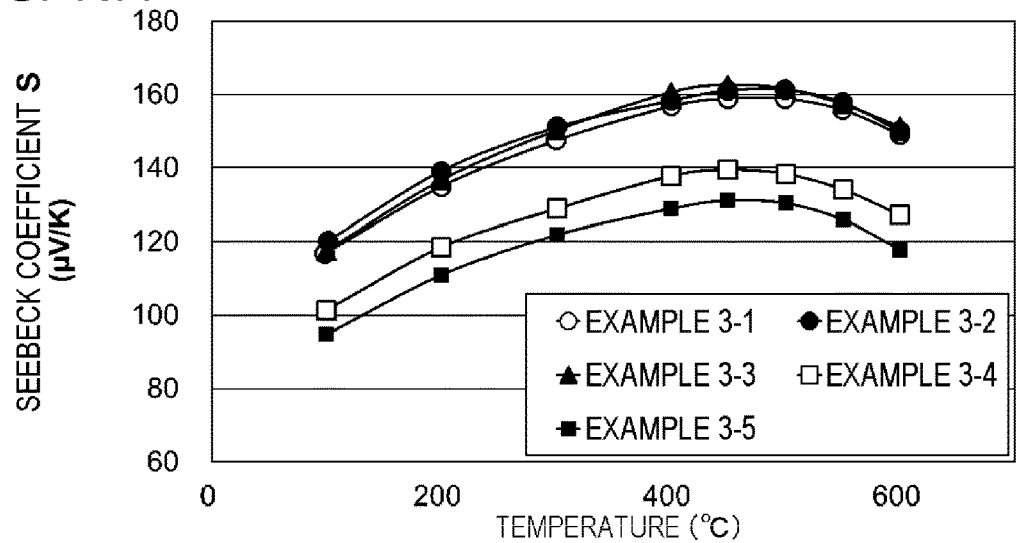
FIG. 10A is a graph showing seebeck coefficients S of Example 3-1 to Example 3-5.
Figure 10B:
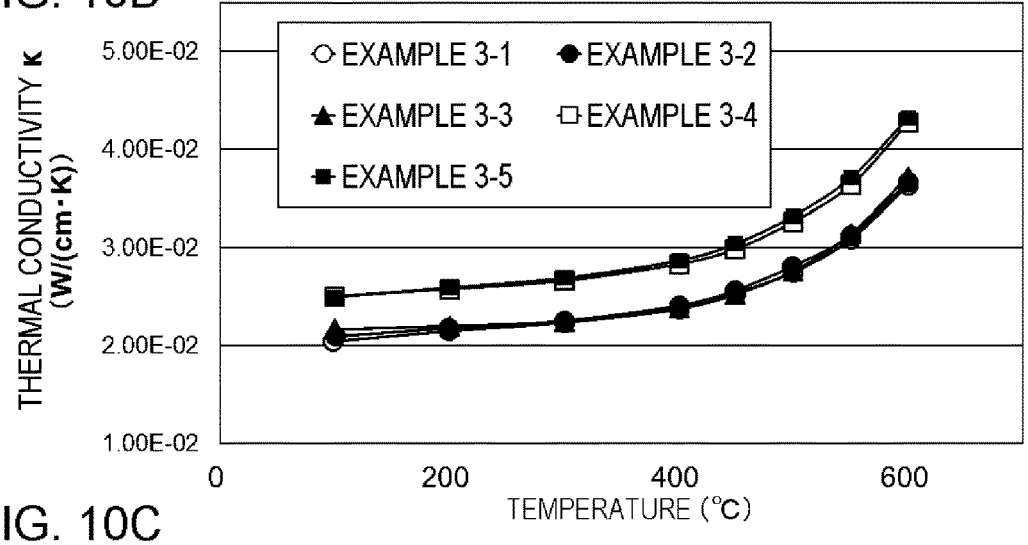
FIG. 10B is a graph showing thermal conductivities K of Example 3-1 to Example 3-5.
Figure 10C:
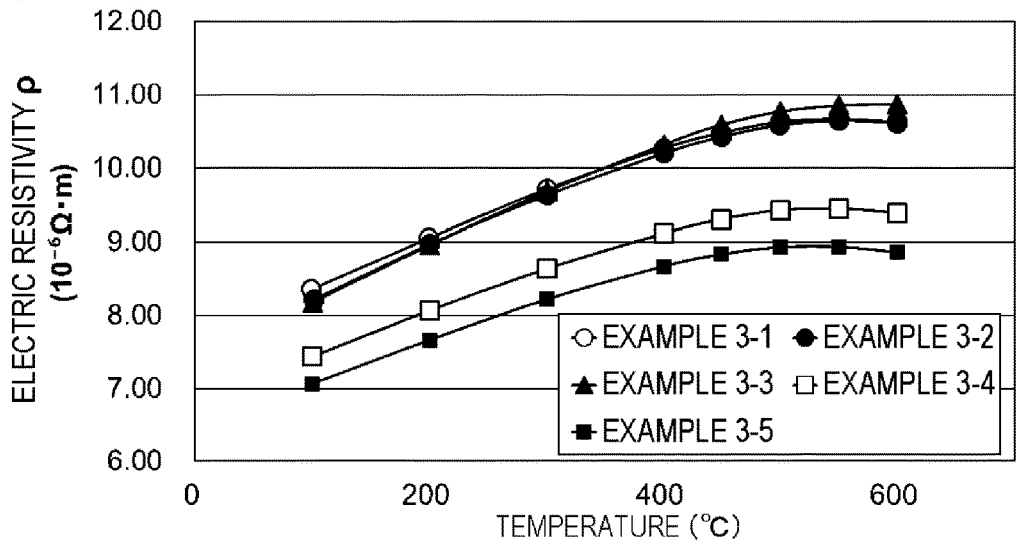
FIG. 10C is a graph showing electric resistivities p of Example 3-1 to Example 3-5.
Figure 11A:
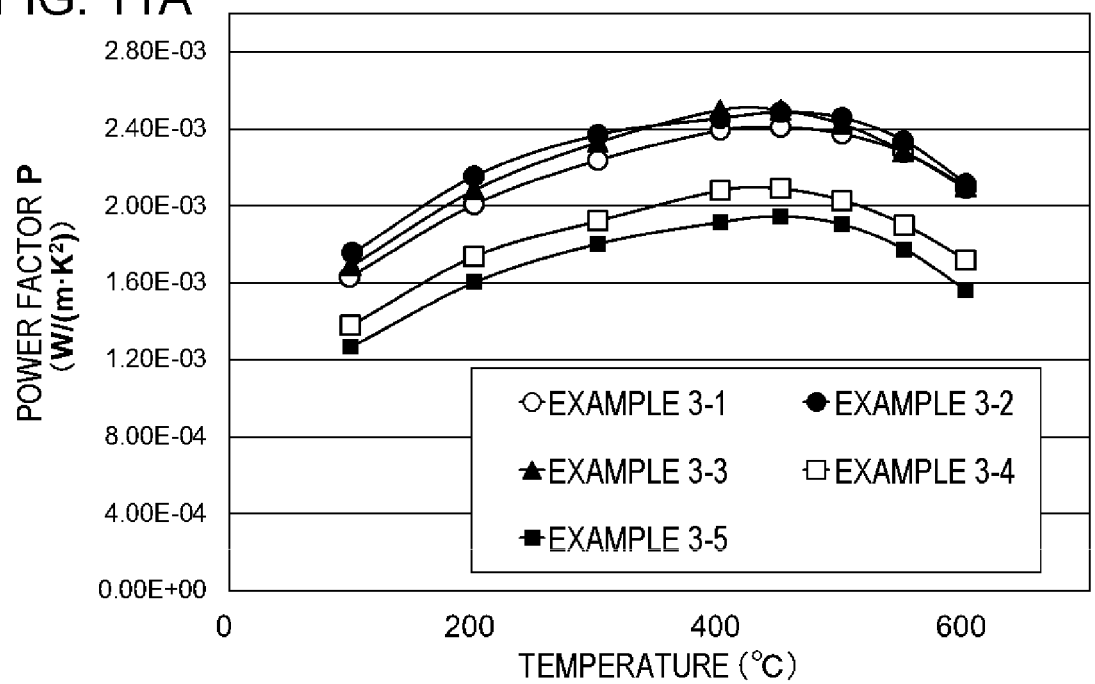
FIG. 11A is a graph showing power factors P of Example 3-1 to Example 3-5.
Figure 11B:
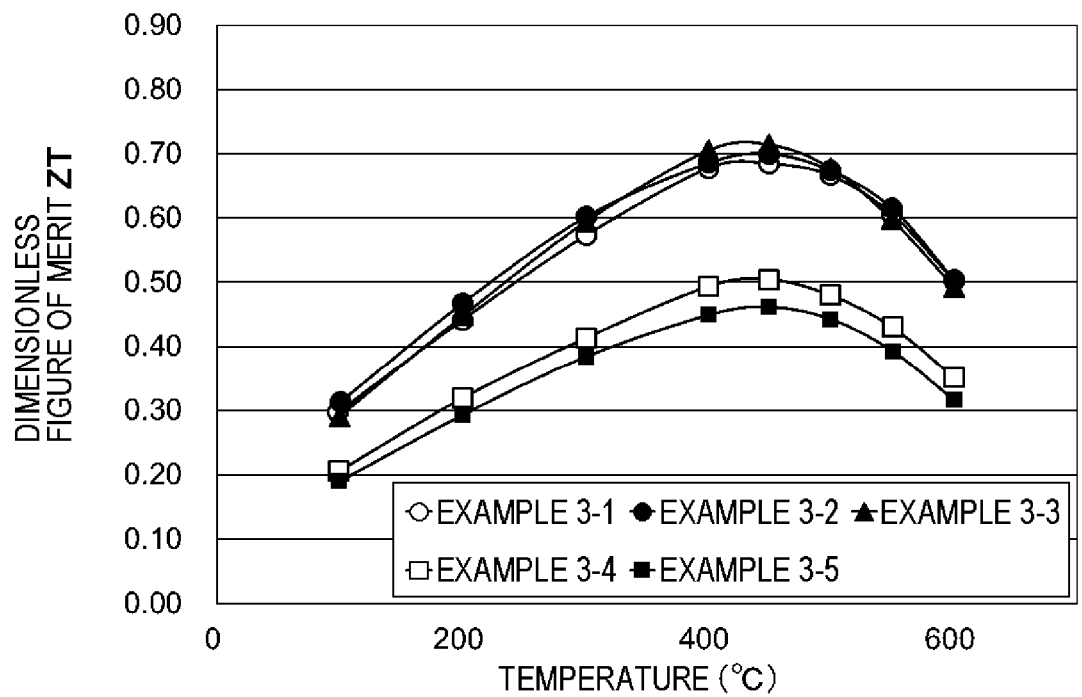
FIG. 11B is a graph showing dimensionless figures of merit ZT of Example 3-1 to Example 3-5.
Figure 12:
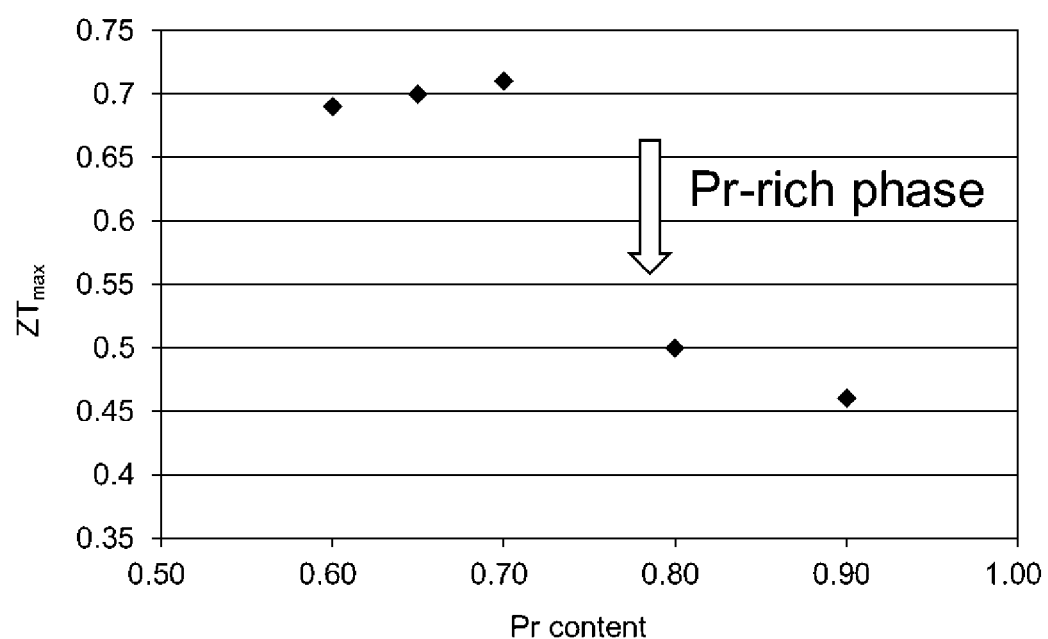
FIG. 12 is a graph showing plotting of maximum values $ZT_{max}$ of dimensionless figures of merit of Example 3-1 to Example 3-5 in a temperature range of 100° C. to 600° C.

FIG. 10A is a graph showing seebeck coefficients S of Example 3-1 to Example 3-5, FIG. 10B is a graph showing thermal conductivities K of Example 3-1 to Example 3-5, and FIG. 10C is a graph showing electric resistivities p of Example 3-1 to Example 3-5. FIG. 11A is a graph showing power factors P of Example 3-1 to Example 3-5, and FIG. 11B is a graph showing dimensionless figures of merit ZT of Example 3-1 to Example 3-5. In addition, FIG. 12 is a graph showing plotting of maximum values $ZT_{max}$ of dimensionless figures of merit of Example 3-1 to Example 3-5 in a temperature range of 100° C. to 600° C. The axis of abscissas of this figure shows a Pr content (value of k in the embodiment), and the axis of ordinates shows a maximum value $ZT_{max}$ of a dimensionless figure of merit in a temperature range of 100° C. to 600° C.

Table 2 collectively shows a molar ratio of each element, a value of x/t, a value of x/(k+r+t), a heat-resistant temperature $T_L$, and a maximum value $ZT_{max}$ of a dimensionless figure of merit in a temperature range of 100° C. to 600° C. From the results shown in Table 2, it was ascertained that in each example, the thermoelectric conversion material has a higher heat-resistant temperature $T_L$ and more excellent heat resistance than in Comparative Example 3-1.

In addition, as Example 4-1, Example 4-2, and Comparative Example 4-1, p-type thermoelectric conversion materials shown in the following were produced.

EXAMPLE 4-1 p-type $Ce_{0.6}Ba_{0.01}Ga_{0.1}Ti_{0.1}Fe_3Co_1Sb_{11}$

EXAMPLE 4-2 p-type $Ce_{0.65}Ba_{0.01}Ga_{0.1}Ti_{0.1}Fe_3Co_1Sb_{11}$

COMPARATIVE EXAMPLE 4-1 p-type $Ce_{0.75}Ba_{0.01}Ga_{0.1}Ti_{0.1}Fe_3Co_1Sb_{12}$

Regarding the thermoelectric conversion materials of Example 4-1, Example 4-2, and Comparative Example 4-1, the evaluation of thermoelectric conversion performance and heat resistance were performed as in Example 2-1 and the like.

Figure 13A:
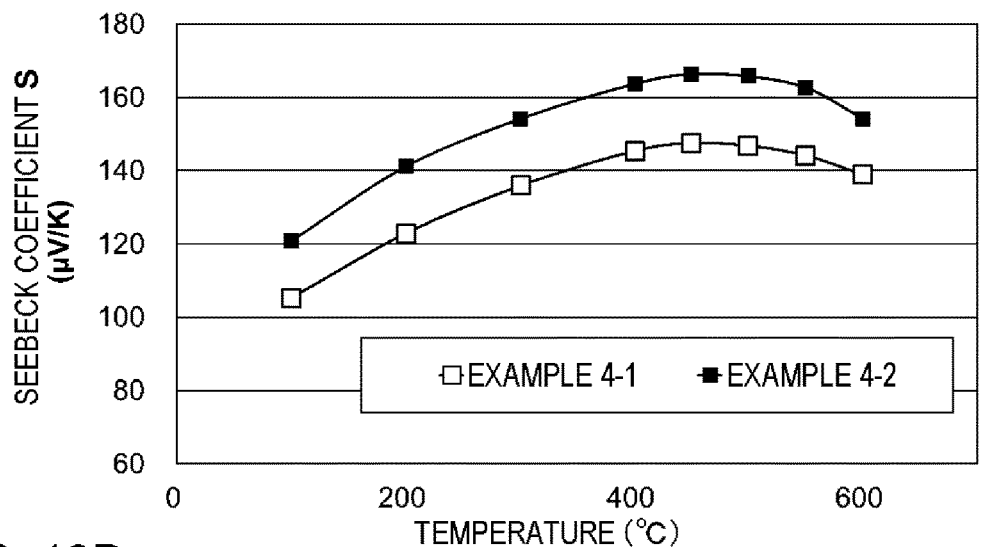
FIG. 13A is a graph showing seebeck coefficients S of Example 4-1 and Example 4-2.
Figure 13B:
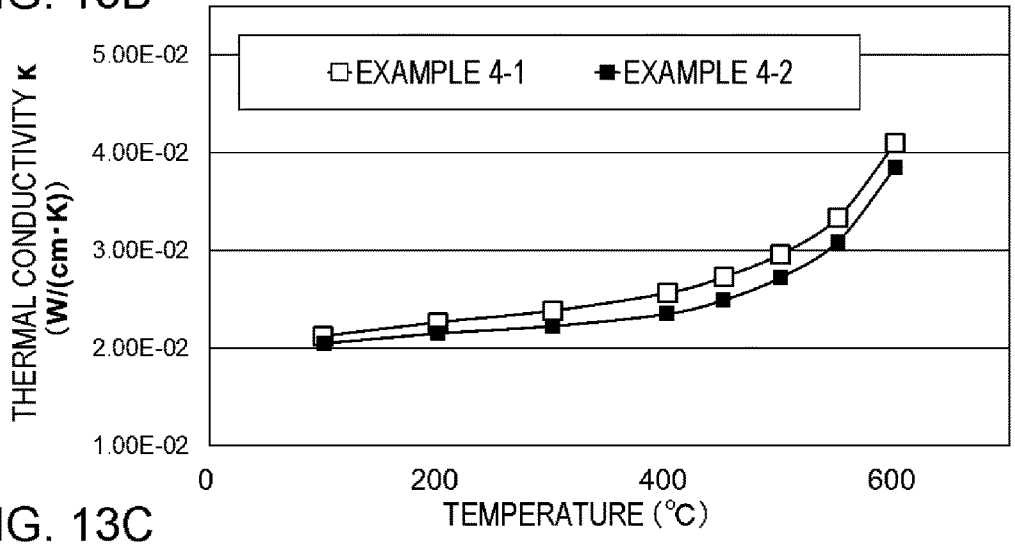
FIG. 13B is a graph showing thermal conductivities K of Example 4-1 and Example 4-2.
Figure 13C:
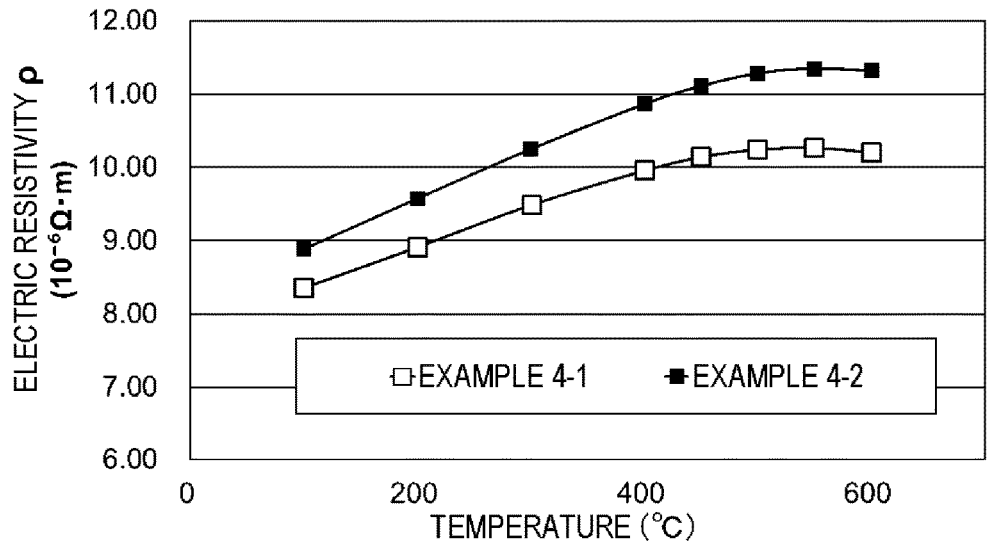
FIG. 13C is a graph showing electric resistivities p of Example 4-1 and Example 4-2.
Figure 14A:
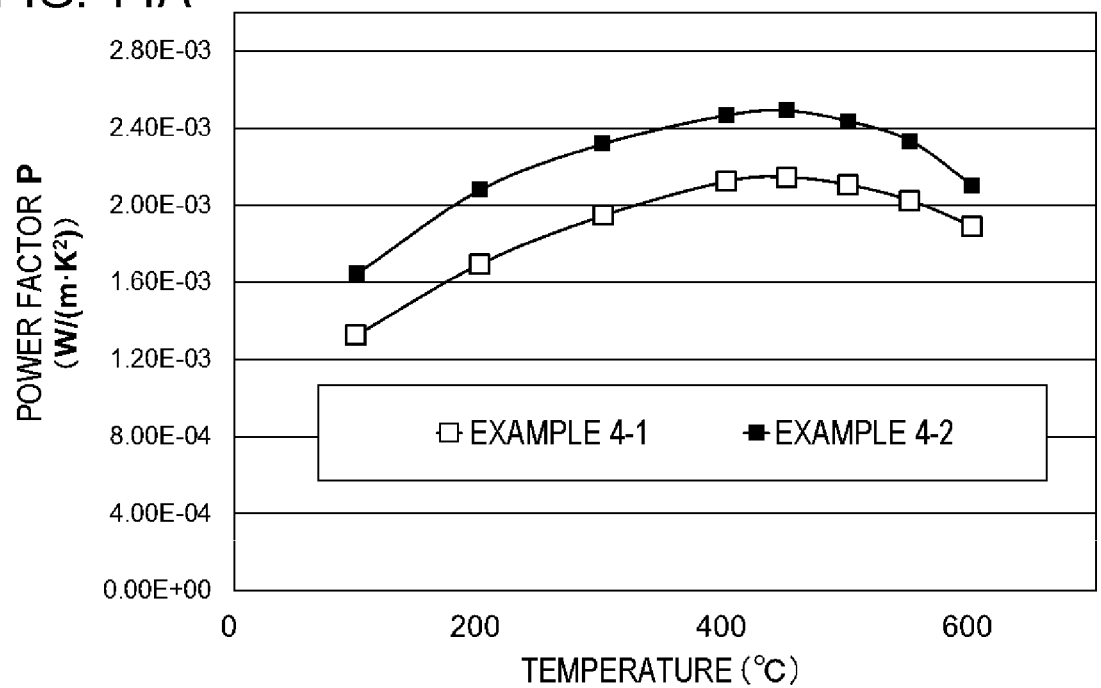
FIG. 14A is a graph showing power factors P of Example 4-1 and Example 4-2.
Figure 14B:
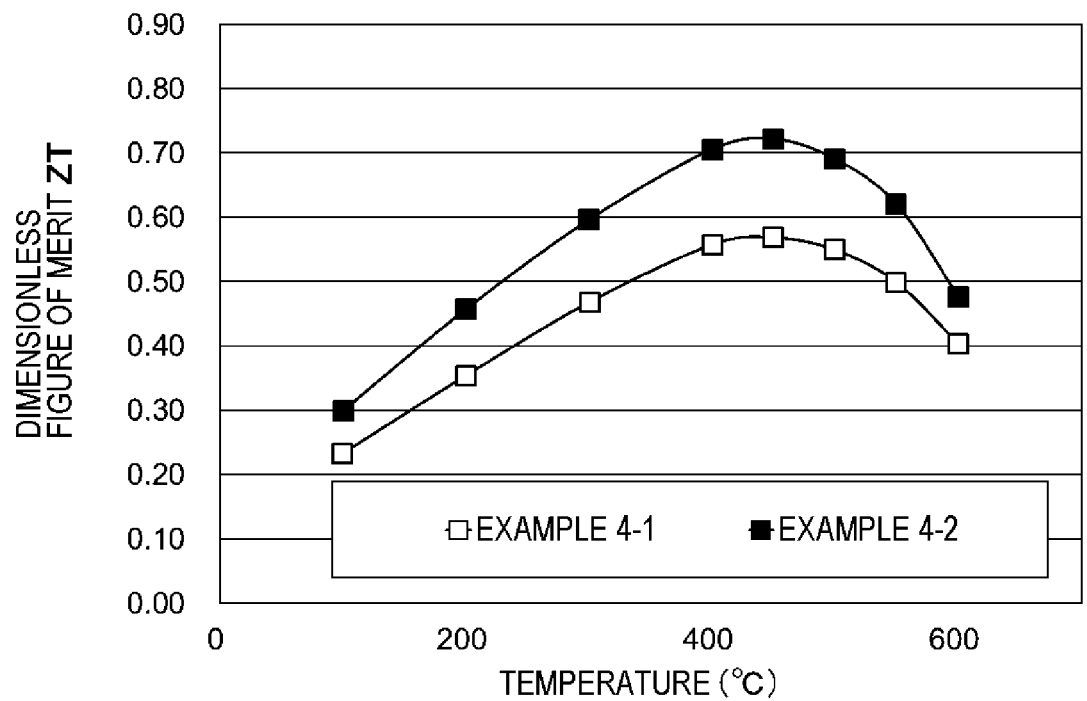
FIG. 14B is a graph showing dimensionless figures of merit ZT of Example 4-1 and Example 4-2.

FIG. 13A is a graph showing seebeck coefficients S of Example 4-1 and Example 4-2, FIG. 13B is a graph showing thermal conductivities K of Example 4-1 and Example 4-2, and FIG. 13C is a graph showing electric resistivities p of Example 4-1 and Example 4-2. FIG. 14A is a graph showing power factors P of Example 4-1 and Example 4-2, and FIG. 14B is a graph showing dimensionless figures of merit ZT of Example 4-1 and Example 4-2.

Table 3 collectively shows a molar ratio of each element, a value of x/t, a value of x/(k+r+t), a heat-resistant temperature $T_L$, and a maximum value $ZT_{max}$ of a dimensionless figure of merit in a temperature range of 100° C. to 600° C. From the results shown in Table 3, it was ascertained that in each example, the thermoelectric conversion material has a higher heat-resistant temperature $T_L$ and more excellent heat resistance than in Comparative Example 4-1.

TABLE 2

| | Pr | Ba | Ga | Ti | Fe | Co | Sb | x/t | x/(k + r + t) | $T_L$ | $ZT_{max}$ |
|---|---|---|---|---|---|---|---|---|---|---|---|
| Example 3-1 | 0.60 | 0.01 | 0.1 | 0.1 | 3.00 | 1.00 | 11.00 | 2.75 | 2.29 | 613 | 0.69 |
| Example 3-2 | 0.65 | 0.01 | 0.1 | 0.1 | 3.00 | 1.00 | 11.00 | 2.75 | 2.26 | 610 | 0.7 |
| Example 3-3 | 0.70 | 0.01 | 0.1 | 0.1 | 3.00 | 1.00 | 11.00 | 2.75 | 2.24 | 605 | 0.71 |
| Example 3-4 | 0.80 | 0.01 | 0.1 | 0.1 | 3.00 | 1.00 | 11.00 | 2.75 | 2.20 | 610 | 0.5 |
| Example 3-5 | 0.90 | 0.01 | 0.1 | 0.1 | 3.00 | 1.00 | 11.00 | 2.75 | 2.15 | 600 | 0.46 |
| Comparative Example 3-1 | 0.75 | 0.01 | 0.1 | 0.1 | 3.00 | 1.00 | 12.00 | 3.00 | 2.42 | 570 | 0.85 |

As shown in FIG. 12, ZT was particularly high in a case where the value of k described in the embodiment satisfied 0.50≤k≤0.70, and $ZT_{max}$ was the highest in Example 3-3 in which k satisfied k=0.70. On the other hand, when k exceeded 0.70, the value of $ZT_{max}$ was dramatically decreased. As in the above description, it is considered that this is due to generation of phases having a high Pr content.

TABLE 3

| | Ce | Ba | Ga | Ti | Fe | Co | Sb | x/t | x/(k + r + t) | $T_L$ | $ZT_{max}$ |
|---|---|---|---|---|---|---|---|---|---|---|---|
| Example 4-1 | 0.60 | 0.01 | 0.1 | 0.1 | 3.00 | 1.00 | 11.00 | 2.75 | 2.29 | 587 | 0.57 |
| Example 4-2 | 0.65 | 0.01 | 0.1 | 0.1 | 3.00 | 1.00 | 11.00 | 2.75 | 2.26 | 624 | 0.72 |
| Comparative Example 4-1 | 0.75 | 0.01 | 0.1 | 0.1 | 3.00 | 1.00 | 12.00 | 3.00 | 2.42 | 554 | 0.8 |

As shown in FIG. 14B, ZT was particularly high and the value of maximum value $ZT_{max}$=0.72 was obtained in Example 4-2 in which k described in the embodiment satisfied k=0.65.

Hereinabove, descriptions on the embodiment of the present invention have been provided with reference to drawings, but these are examples of the present invention and various configurations other than these can be employed.

It is apparent that the present invention is not limited to the above embodiment, and may be modified and changed without departing from the scope and spirit of the invention.

What is claimed is:

1. A thermoelectric conversion material having a composition represented by General Formula $L_kR_rT_{t-m}M_mSb_x$,
    wherein L represents at least one element selected from rare earth elements,
    wherein R represents three or more elements selected from the group consisting of alkali metal elements, alkali earth metal elements, Group 4 elements, and Group 13 elements,
    wherein the three or more elements include Ba, Ga and Ti,
    wherein T represents Fe and Co,
    wherein M represents at least one element selected from the group consisting of Ru, Os, Rh, Ir, Ni, Pd, Pt, Cu, Ag, and Au, and
    wherein $0.50 \leq k \leq 1.00$, $0.1 \leq r \leq 0.5$, $3.0 \leq t-m \leq 5.0$, $0 \leq m \leq 0.5$, $10.0 \leq x \leq 11.5$, and $x/t<3.0$ are satisfied.

2. The thermoelectric conversion material according to claim 1,
    wherein a major phase has a filled skutterudite structure.

3. The thermoelectric conversion material according to claim 2, comprising:
    first and second phases,
    wherein the first phase is the major phase,
    wherein a proportion accounted for by the first phase in all of the thermoelectric conversion material is 60% or more, and
    wherein a proportion accounted for by the second phase in all of the thermoelectric conversion material is 0.1% or more.

4. The thermoelectric conversion material according to claim 1,
    wherein $x/(k+r+t)<2.40$ is satisfied.

5. The thermoelectric conversion material according to claim 1,
    wherein R represents elements of more than three groups which are different from one another.

6. The thermoelectric conversion material according to claim 1,
    wherein $0.50 \leq k \leq 0.70$ is satisfied.

7. The thermoelectric conversion material according to claim 1,
    wherein $10.5 \leq x \leq 11.5$ is satisfied.

8. The thermoelectric conversion material according to claim 1,
    wherein L is La, Ce, or Pr.

9. The thermoelectric conversion material according to claim 1,
    wherein m=0 is satisfied.

10. The thermoelectric conversion material according to claim 1,
    wherein a maximum value of a dimensionless figure of merit ZT in a temperature range of 100° C. to 600° C. is 0.60 or more.

* * * * *